United States Patent [19]
Nakayama et al.

[11] Patent Number: 6,133,691
[45] Date of Patent: Oct. 17, 2000

[54] ORGANIC LIGHT EMITTING ELEMENT WITH RESONANT STRUCTURE

[75] Inventors: Takahiro Nakayama, Fukuoka; Shinya Kobayashi, Mito; Akira Shimada, Hitachi, all of Japan

[73] Assignee: Hitachi, Ltd., Tokyo, Japan

[21] Appl. No.: 08/984,041

[22] Filed: Dec. 3, 1997

[30] Foreign Application Priority Data

Apr. 12, 1996 [JP] Japan ................................. 8-337672
Feb. 18, 1997 [JP] Japan ................................. 9-33580

[51] Int. Cl.[7] .................................................. H05B 33/04

[52] U.S. Cl. ......................... 313/504; 313/506; 313/503

[58] Field of Search ................................. 313/504, 503, 313/506, 509, 505, 512, 501

[56] References Cited

PUBLICATIONS

"Investigations on Multicolor Display by Organic Luminescent Devices with Optical Microcavity Structure", by Nakayama, Tsunoda, and Nagae, The transaction of the Institute of Electronics, Information, and Communication Engineers of Japan, J77–C–11, pp. 437–443, 1994.

*Primary Examiner*—Nimeshkumar D. Patel
*Assistant Examiner*—Joseph Williams
*Attorney, Agent, or Firm*—Antonelli, Terry, Stout & Kraus, LLP

[57] ABSTRACT

An organic light emitting element having a metal thin film on an upper surface of an organic thin film, is produced by mechanically cutting the metal thin film, using the cut metal thin film as a mask, and applying dry etching processing to the whole of the organic thin film and to a part of each of the thin films on the upper and lower surfaces of the organic thin film.

5 Claims, 12 Drawing Sheets

LIGHT EMITTING LAYER : ALQ    HOLE TRANPORT LAYER : TAD

ORGANIC LIGHT EMITTING ELEMENT WITH RESONANT STRUCTURE

BACKGROUND INVENTION

The present invention relates to an organic light emitting element, especially to an organic light emitting element of the type used in optical instruments having an optical device, such as a light source, for display, an optical circuit, an optical switch, an optical array, an optical communication element, a head for optical recording, and so forth.

A resonator structure formed by sandwiching an organic light emitting thin film between two plane reflectors is used in a conventional electro-luminescent element, as disclosed, for example, in a paper titled "Investigations on Multicolor Display by Organic Luminescent Devices with Optical Microcavity Structure", by Nakayama, Tsunoda and Nagae, The Transaction of the Institute of Electronics, Information and Communication Engineers of Japan, J77-CII, pp 437–443 (1994).

In an organic electro-luminescent element using a conventional micro-resonator structure, no means is provided for confining light proceeding in a direction parallel to the organic electro-luminescent film, and so light proceeding in that direction is lost. This problem occurs similarly in an ordinary type electro-luminescent element in which a micro-resonator structure is not used.

In the following, an explanation will be given as to why light proceeding in a direction parallel to an organic electro-luminescent film attenuates and is lost. At first, with reference to FIG. 11, a method of producing an organic light emitting element will be explained. Reference mark A indicates a substrate of the organic light emitting element, and a film B is formed by a vapor deposition method using an organic material. Regions to be masked from vapor deposition of the organic material vaporized in a vapor deposition source D are masked by a metal mask C.

In the vapor deposition apparatus shown in FIG. 11, a very narrow gap, which can be observed only by an optical microscope, exists between an edge of the mask C and the surface of the growing organic thin film. The gap is generated by unevenness of the substrate A, a bend in the mask C, a roundish shape of the edge part of the mask C, etc. Assuming that the width of the gap is 0.1 mm (=100 $\mu$m), and the visual angle of the vapor deposition source D viewed from the edge part is 2 deg., the variation in the growing length of the thin film is 3.5 $\mu$m (=100 $\mu$m×tan(2 deg.)). That is, the thickness of the thin film changes from 100% to 0% in the interval of 3.5 $\mu$m.

Usually, since the thickness of an organic thin film, such as one used for an organic light emitting element, is about 0.1 $\mu$m, the ratio of the thickness of the organic thin film to the thickness changing interval is 1/35. Therefore, if the thin film is formed by a vapor deposition method using a mask, the angle of the edge part in the thin film is 1.6 deg. (=arc tan (1/35)) as shown in FIG. 12. Thus, light which enters the above-mentioned edge part of the thin film is repeatedly reflected by the inner faces of the thin film as it proceeds, as shown in FIG. 12, and attenuates until finally it is extinguished.

SUMMARY OF THE INVENTION

A first object of the present invention is to provide an organic light emitting element wherein light proceeding in parallel to an organic thin film, which ordinarily would be lost, can be effectively utilized.

A second object of the present invention is to provide an organic light emitting element wherein a classical or quantum effect (correction of light emission enhancement due to the transition probability mechanism) brought about by the confinement or resonance of light is applicable.

A third object of the present invention is to provide a method of producing a highly pure organic thin film used in an organic light emitting element. To attain the above objects, the present invention has the following features.

A first feature of the present invention is to provide an organic light emitting element, including an organic thin film formed on a substrate, wherein a peripheral side surface of the organic thin film has a sectional shape such that emitted light is reflected by the side surface.

A second feature of the present invention is to provide an organic light emitting element, including an organic thin film formed on a substrate, wherein the difference between a refraction index of the organic thin film and that of an ambient substance outside the organic thin film is set such that emitted light is confined in the organic thin film by a peripheral side surface of the organic thin film.

A third feature of the present invention is to provide an organic light emitting element, including an organic thin film formed on a substrate, wherein a peripheral side surface of the organic thin film stands, in a range of 50%–90% of the thickness of the organic thin film, perpendicular to the substrate.

A fourth feature of the present invention is to provide an organic light emitting element, comprising a multilayer element formed of a translucent reflector film, a transparent electrode, a light emitting layer and a metal electrode, wherein an optical resonator is positioned between the translucent reflector film and the metal electrode on the light emitting layer in a direction perpendicular to the organic light emitting layer, and a plurality of layer parts, each of the layer parts including the light emitting layer and the metal electrode, are separately arranged in a plane parallel to the substrate, respectively, the distance between each corresponding layer in neighboring layer parts being larger than ¼ of a wavelength of light emitted in the light emitting element.

A fifth feature of the present invention is to provide a method of producing an organic light emitting element including an organic thin film, the method comprising the steps of forming a metal thin film on the organic thin film, forming a mask of a desired pattern by physically or mechanically removing parts of the metal thin film, and applying dry etching processing to the organic thin film with the mask.

A sixth feature of the present invention is to provide an organic light emitting element having a resonator structure arranged in a direction perpendicular to a substrate of the light emitting element, the resonator structure being formed by sandwiching an organic thin film in the light emitting element between two reflectors, the organic light emitting element comprising one of a line layer structure and a dot layer structure in the organic thin film and a part of the thin films formed on the top face and bottom face of the organic thin film, in which line layers or dot layers are periodically arranged in parallel to the organic thin film, wherein each two line layers neighboring each other or each two dot layers neighboring each other have a different material composition or material structure, and the period of the arrangement, which is represented by an optical length expressed as a geometrical length×a refraction index in material of each layer, is substantially ¼ of a wavelength of light emitted in the organic thin film.

DETAILED DESCRIPTION OF THE EMBODIMENTS

Details of various embodiments according to the present invention will be explained with reference to the drawings.

Figure 1:
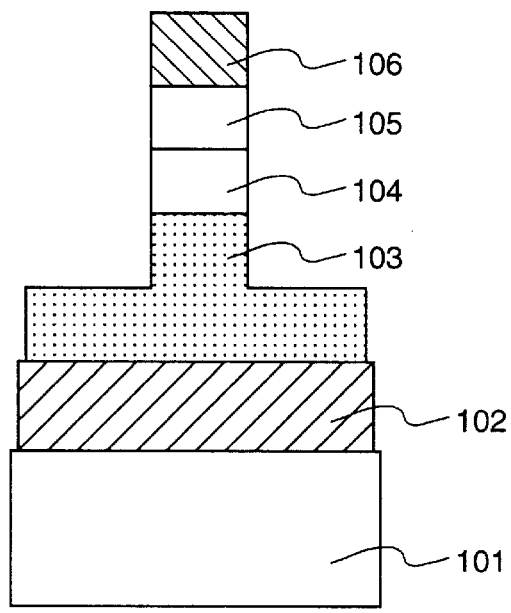
FIG. 1 is a sectional view of an organic electro-luminescence (light emitting) element having a micro-resonator structure, of which a peripheral side face is processed.

FIG. 1 shows an organic light emitting element having a micro-resonator structure, representing an embodiment according to the present invention. Shaping a peripheral side face of the organic light emitting element, by removing a part thereof outside an area to be formed as a light emitting element is carried out to an intermediate position in the thickness of a transparent electrode film 103. In FIG. 1, a laminated two layer type p/n EL (Electro-Luminescence) element composed of a light emitting layer and a hole transport layer is shown. However, a one layer type or a more than two layer type organic light emitting element, in which functions of the above-mentioned two organic layers are integrated into one organic layer, or are shared by more than two organic layers, has been reported, and those types of organic light emitting elements also can be used for the present invention.

In FIG. 1, a translucent film 102 mace of titanium oxide or silicon dioxide is formed on a glass substrate 101, and a transparent electrode 103, a hole transport layer 104, a light emitting layer 105 and a metal back surface electrode 106 are layered in turn on the translucent film 102. As the above material, the material described in the above-mentioned paper presented in the transaction of the institute of electronics, information and communication engineers C-II, J77-C-II, 437 (1994), by the inventor of the present invention, etc., can be used, and other kinds of material having a property similar to that of the above material are also applicable to the present invention.

Furthermore, a feature of the present invention is that a peripheral side face of the organic thin film is shaped such that the side face functions as a translucent reflector due to the difference between a refraction index of the organic thin film and that of the ambient substance outside the organic thin film, and light emitted in the organic thin film is reflected into the inside of the organic thin film by the side face. That is, the attenuation and the extinction of emitted light is prevented by forming the above-mentioned interval in which the thickness of the organic thin film gradually changes, as small as possible, and confining the emitted light in the organic thin film.

Figure 2:
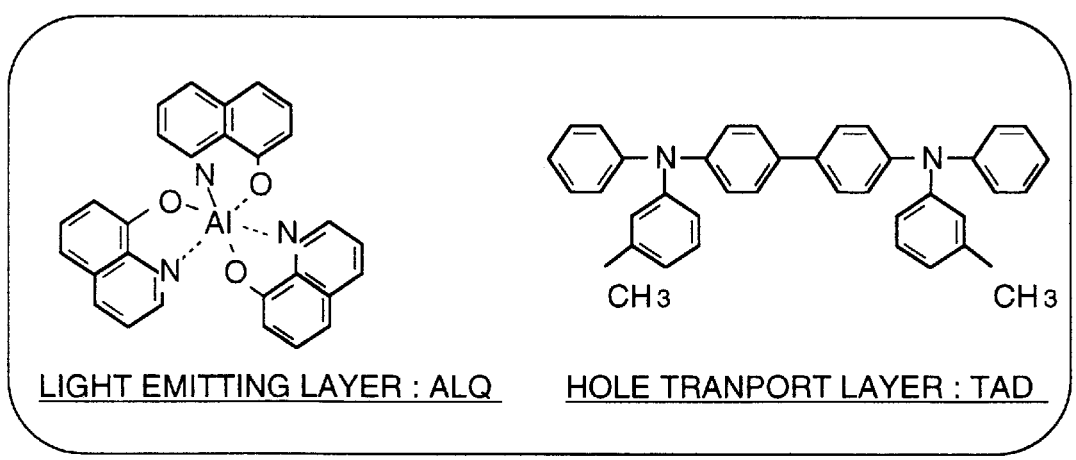
FIG. 2 is a diagram showing the compositions of examples of material used in the organic thin film shown in FIG. 1.
Figure 3:
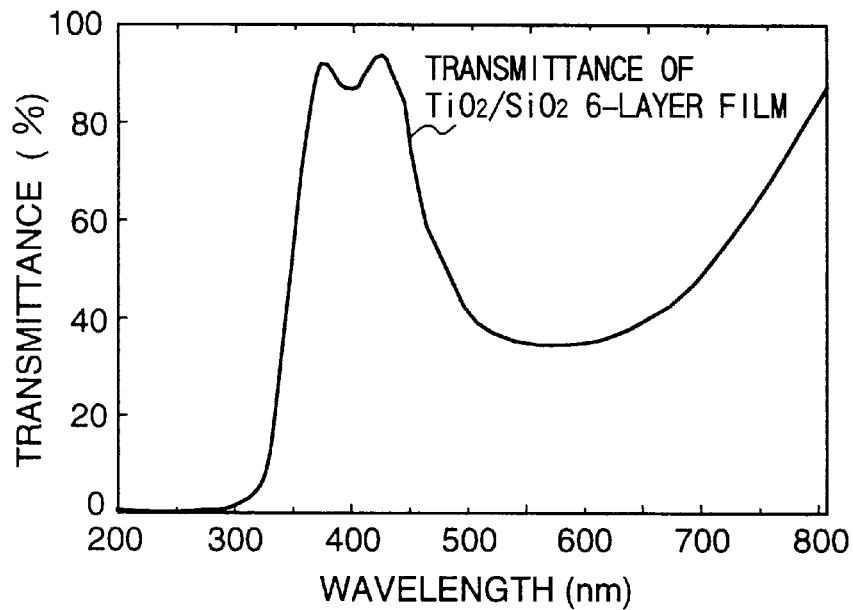
FIG. 3 is a graph showing light transmission characteristics of a translucent reflection layer used in the organic electro-luminescence element.

The light emitting layer 105 and the hole transport layer 104 are made of, for example, aluminum chelate (ALQ) and triphenyl-diamine (TAD), respectively, and their chemical structures are shown in FIG. 2. The transmittance of the dielectric translucent reflection film 102, formed of a 6-layer laminated film composed of titanium oxide layers and silicon dioxide layers is indicated in FIG. 3. In the region of more than 400 nm wavelength, light which is not transmitted in the translucent reflection film 102 is almost entirely reflected by the translucent reflection film 102.

Figure 4:
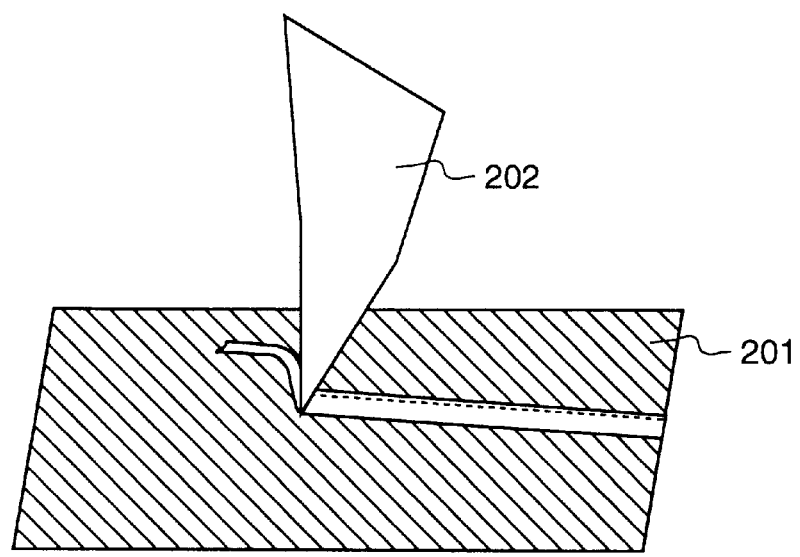
FIG. 4 is an conceptual diagram for showing a cutting process for producing the organic electro-luminescence element according to the present invention.
Figure 5:
FIG. 5 is a scanning tunneling microscope (STM) image of a sectional face of an organic electro-luminescence element which was cut by an cutting process.
Figure 6:
FIG. 6 is a scanning electron microscope (SEM) image of a sectional face of an organic electro-luminescence element which was etched by an etching process.

The organic light emitting element according to the present invention is produced by a cutting process and a dry etching process. In the cutting process, a sharp edge of a cutting device, made of glass, etc., is operated at a surface of a formed metal back surface electrode 106 in an organic light emitting element. The cutting process is typically illustrated in FIG. 4. An electron microscope sectional image of the light emitting element for which the cutting process is performed is shown in FIG. 5. Moreover, an electron microscope sectional image of the light emitting element for which the dry etching process is further performed is shown in FIG. 6. The etching conditions are indicated in Table 1. As shown in FIG. 5 and FIG. 6, a part outside the part designed to be left remaining, of the organic thin film, was removed by the etching process, and a peripheral side face of the remaining organic thin film part was finely shaped.

TABLE 1

| Gas | $CF_1$ (10%) + $O_2$ (90%) |
|---|---|
| Pressure | 2 Pa |
| RF power | 200 W |

In FIG. 5 and FIG. 6, the label QUARTZ indicates the glass substrate 101, the symbol ITO indicates the transparent electrode 103, the symbol TAD indicate the hole transport layer 104, the symbol ALQ indicates the light emitting layer 105, and the symbol ALLELE indicates the metal back surface electrode 106.

Furthermore, the above mentioned processes for producing an organic light emitting element have an advantage in that an organic light emitting element can be produced without using a chemical substance, such as a resist. To bring an organic EL element fully in effect, it is important to maintain the high purity of the organic thin film material. The mixing of a very small impurity deteriorates the performance of an organic EL element in the extreme. Moreover, since the thickness of an organic thin film is about 100 nm, and its volume is also very small, diffusion mixing of a very small impurity from substance, such as a resist, largely degrades the performance of the organic thin film. The above-mentioned production method, according to the present invention, can solve this problem of impurity. Furthermore, the production cost of an organic light emitting element can be further reduced by using a cutting device exclusive to a masking pattern in comparison with a production method using a resist.

The accuracy of a micro-cutting process depends on the accuracy of moving the edge of a cutter or of driving a substrate. By applying a micro-control technique of the type used to control a stage position in a STM (Scanning Tunneling Microscope) or a SEM (Scanning Electron Microscope), the accuracy of the micro-cutting at the micron level or less is possible.

Although it is desirable for the peripheral side face of an organic thin film to be ideally perpendicular to the surface of the substrate, if the peripheral side face of the organic thin film, in a range of about 40%–90% of the thickness of the organic thin film, is perpendicular to the surface of the substrate, light emitted in the organic thin film can be sufficiently reflected by the peripheral side face, in other words, can be confined in the organic thin film.

Figure 7A:
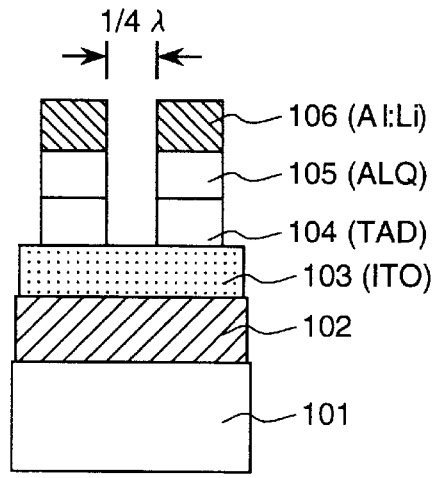
FIGS. 7A to 7C are sectional views of light emitting elements whose depths, formed by the etching process, are different from each other, which elements are etched in their depth to the bottom surface of the organic thin film, to the bottom surface of an ITO film, and to the bottom surface of a translucent reflection film, respectively.
Figure 7B:
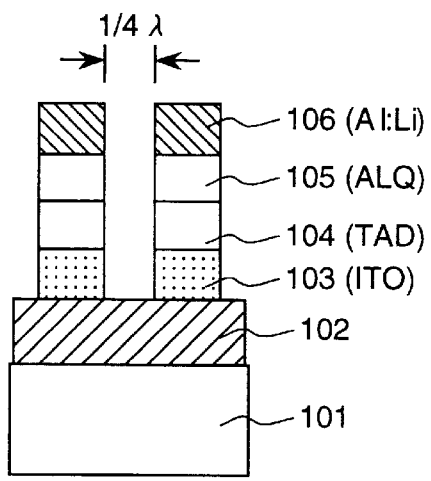
Figure 7C:
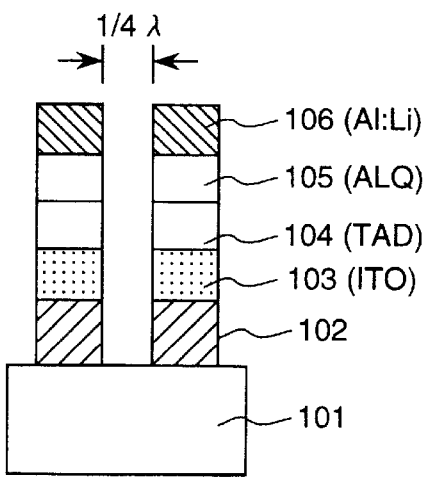

FIGS. 7A, 7B and 7C shows sectional views of light emitting elements of which the depths formed by the etching process are different from each other. FIG. 7A shows a sectional view of a light emitting element, which is etched in depth to the bottom surface of the layer 104, FIG. 7B shows a sectional view of a light emitting elements, which is etched in depth to the bottom surface of the ITO film 103 and FIG. 7C shows a sectional view of a light emitting elements, which is etched in depth to the bottom surface of the translucent reflection film 102. In selecting one of the above-mentioned three types of elements, an element which is optimal for an object using an organic light emitting element is selected by considering the production cost and the effect of light reflection by the side face. In order to etch an organic light element deeply, it is necessary to use a metal back surface electrode film having a large thickness or to use a low etching speed type material as the electrode film, or to mount a layer of low etching speed type material on the electrode and cut the mounted layer and the electrode film together.

Figure 8:
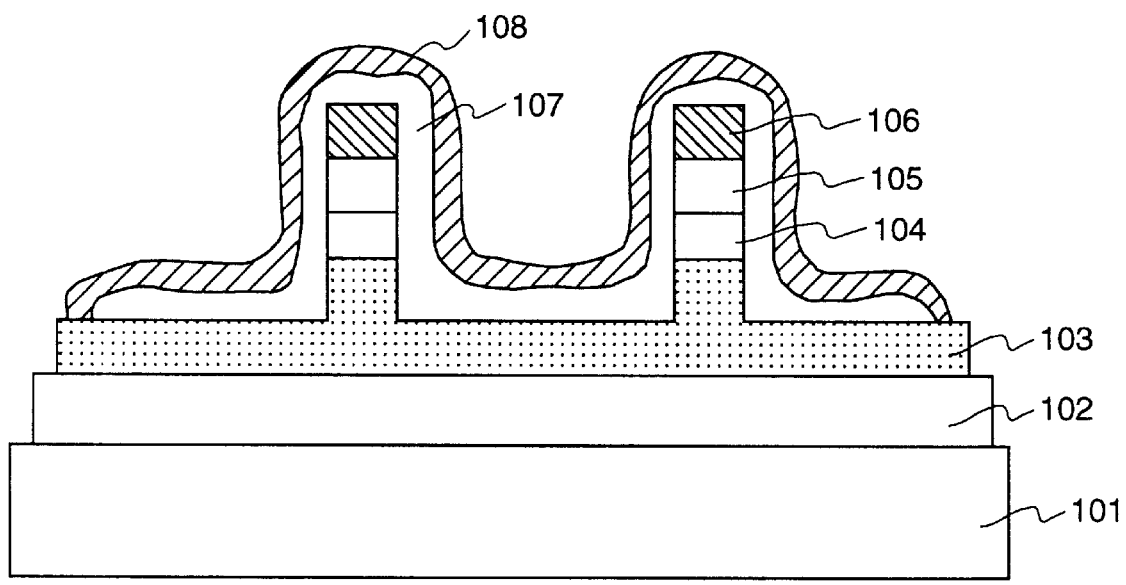
FIG. 8 is a sectional view of an element in which, by forming an insulation film on an organic light emitting element, further covering over the insulation film with a metal reflection film, the effect of light reflection by a side face is further improved.

As shown in FIG. 8, by forming an insulation film on an organic light emitting element, and then covering over the insulation film with a metal reflection film, the effect of light reflection by the side face is further improved.

Figure 9A:
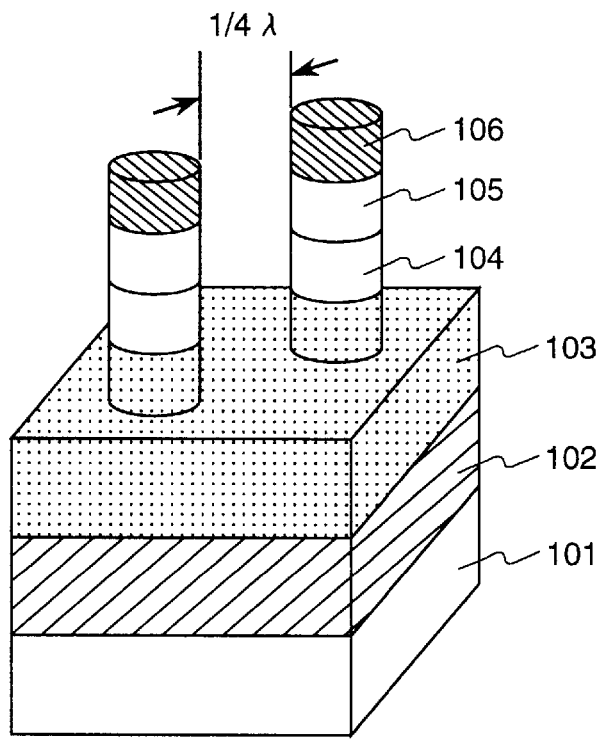
FIGS. 9A and 9B shows sectional views of organic light emitting elements having a three-dimensional light confinement structure, and a two-dimensional light confinement structure, respectively.
Figure 9B:
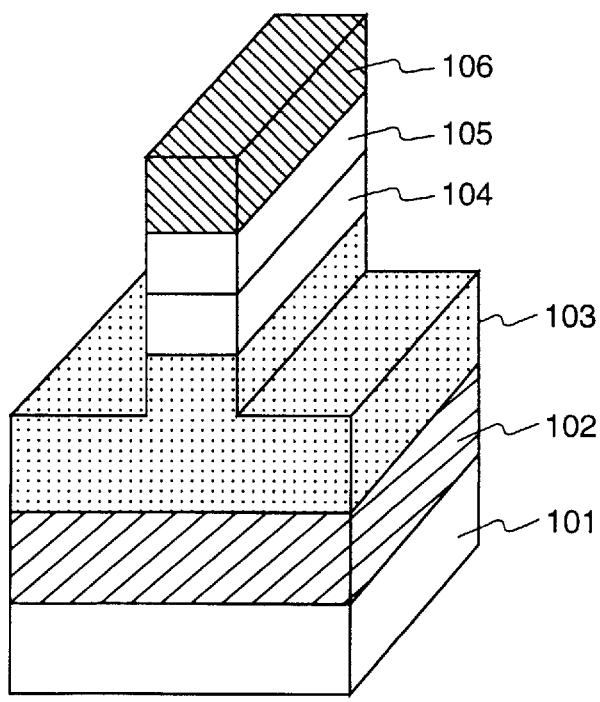

FIG. 9A is a perspective view of organic light emitting elements having a three-dimensional light confinement structure, and FIG. 9B is a perspective view of an organic light emitting element having a two-dimensional light confinement structure.

Figure 13:
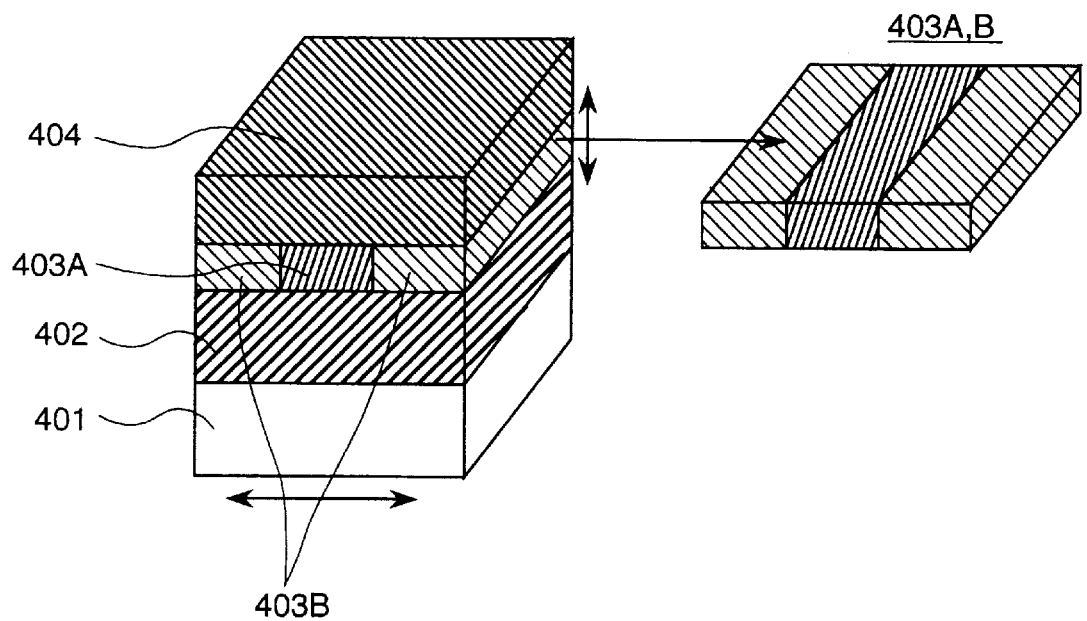
FIG. 13 is a diagrammatic perspective view for showing a composition of an organic light emitting element having a micro-resonator structure wherein a light emitting layer has a structure of a periodically arranged line layer pattern.

FIG. 13 shows an organic thin film light emitting element having a resonator structure provided in a direction perpendicular to the thin film, and including a translucent reflection film composed of a laminated dielectric multilayer thin film. In FIG. 13, the structure includes a glass substrate 401, a translucent reflection film 402 formed of 6 laminated layers composed of titanium oxide layers and silicon dioxide layers, an organic light emitting thin film 403A, 403B, and a metal back surface electrode 404 made of an Al:Li alloy. The organic light emitting thin film (403A and 403B) has a periodically arranged line type layer structure. In FIG. 13, the structure of the organic light emitting thin film (403A and 403B) is separately shown. The metal back surface electrode 404 is formed at the top of the organic light emitting thin film (403A and 403B) by a vapor deposition method, after the light emitting thin film having a periodically arranged line layer structure is formed. By irradiating the light emitting thin film with ultra-violet light, the layer is excited, and it emits visual light.

Figure 15:
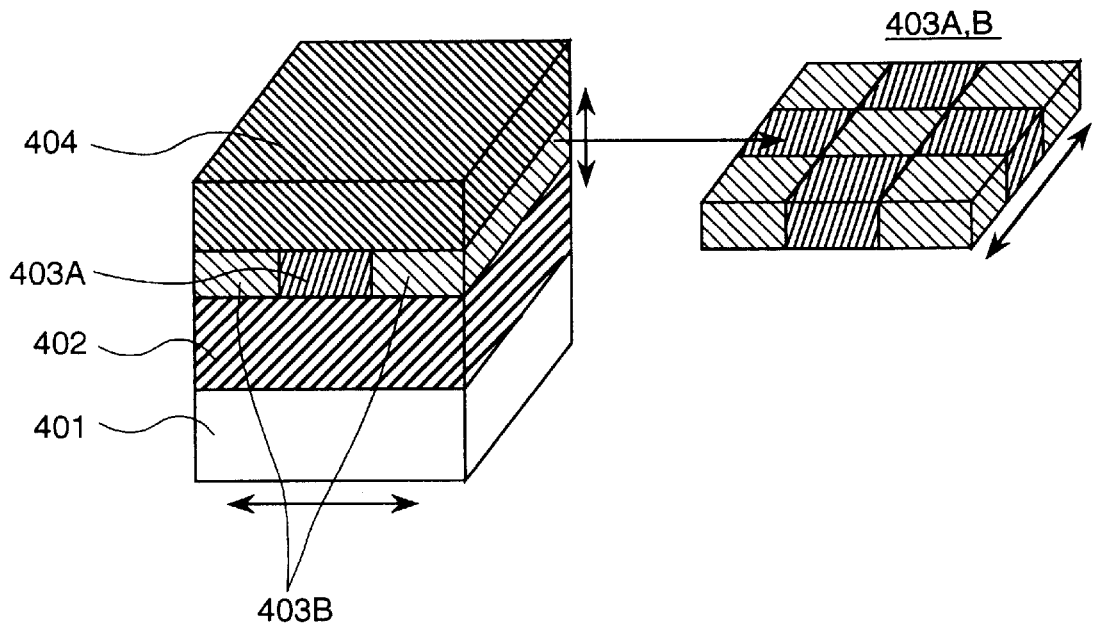
FIG. 15 is a diagrammatic perspective view for showing a composition of an organic light emitting element having a micro-resonator structure wherein a light emitting layer has a structure of a periodically arranged dot layer pattern.

FIG. 15 is an illustration showing the composition of a light emitting element wherein an organic light emitting thin film has a structure of a periodically arranged dot layer pattern. In a light emitting layer having a structure of a periodically arranged line layer pattern, only light proceeding in a direction perpendicular to each line is reflected. On the other hand, in a light emitting thin film having a structure of a periodically arranged dot layer pattern, light proceeding in two directions perpendicular to each other is reflected.

Figure 16:
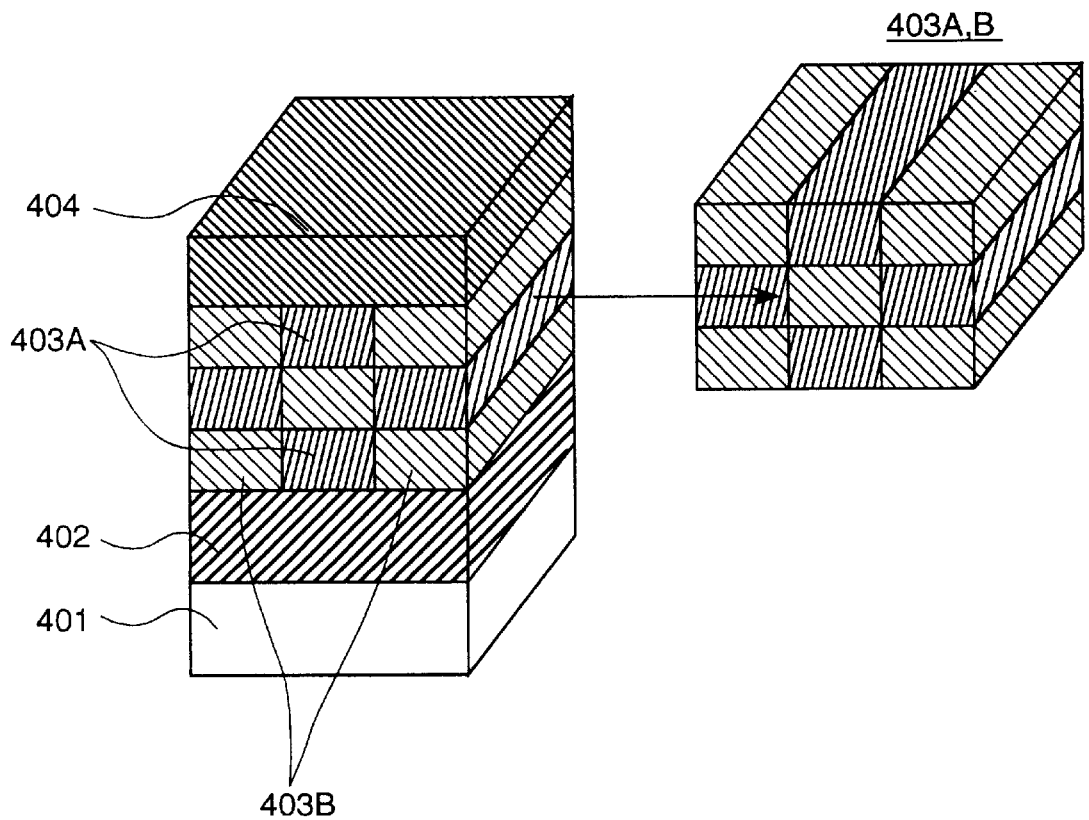
FIG. 16 is a diagrammatic perspective view for showing a composition of an organic light emitting element having a micro-resonator structure wherein a light emitting layer has a structure of a periodically arranged layer pattern in the direction perpendicular to the substrate, in addition to the direction parallel to the substrate.

FIG. 16 is an illustration showing the composition of a light emitting element wherein an organic light emitting thin film has the structure of a periodically arranged layer pattern in a direction perpendicular to the substrate, in addition to a direction parallel to the substrate. This structure of the organic light emitting thin film is formed by repeatedly applying a series of processes for forming an organic thin film and processing a periodically arranged layer pattern in a direction perpendicular to the substrate.

Figure 14:
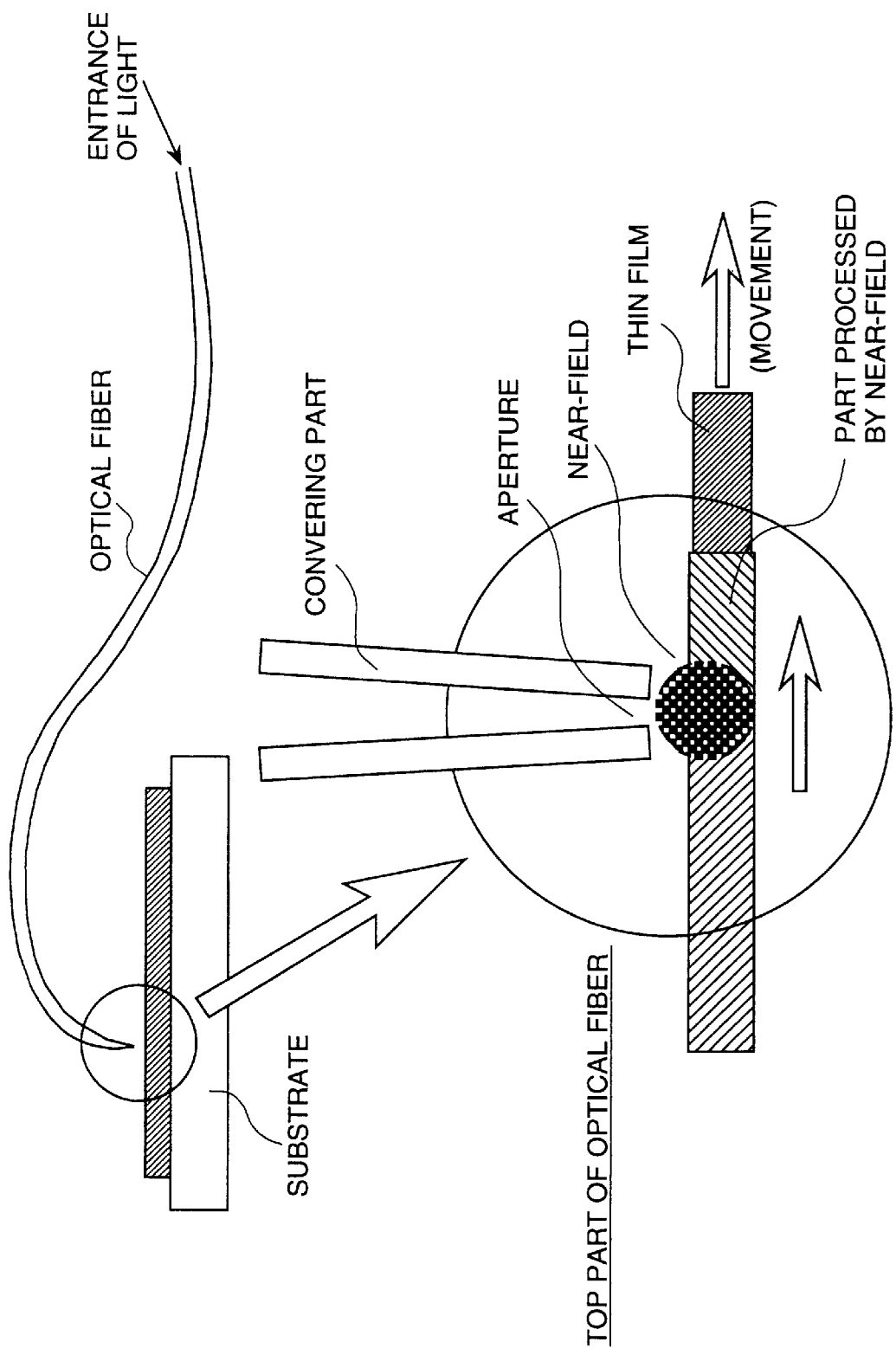
FIG. 14 is a diagram for explaining a method of producing a periodically arranged line or dot layer minute pattern.

In FIG. 14, a minute processing of a substance, for which light sent through an optical fiber is used, is typically and conceptually illustrated. In the minute processing, light sent through an optical fiber is emitted from an aperture in the fiber. If the size of the aperture is as small as ¼ of a wavelength of the light, usual light can not proceed out of the aperture. In this situation, light can exist only at a very small local area of a size of about ¼ wavelength, which is a so-called near-field, generated in the vicinity of the outside of the aperture. It has been reported in App. Phys. Lett. 61, p. 142 that by moving the aperture in the fiber, a substance can be minutely processed by the light at the near-field.

By forming the above-mentioned structures for confining emitted light in a light emitting thin film, a light resonator is formed in a light emitting element, and it is possible to form a light emitting element such that a classical or quantum effect (correction of light emission enhancement due to the transition probability mechanism) due to the light confinement or the light resonance is applied to the light emitting element. Naturally, since the effect of light reflection by the side face becomes relatively larger as the surface area of the light emitting element decreases, the effect of the shape in the side face according to the present invention also becomes larger.

Hereupon, it is necessary to set the distance between two light emitting elements neighboring each other to more than ¼ of a wavelength λ of emitted light, for which the etching processes were performed for the structures shown in FIGS. 7A–7C, FIG. 8 and FIG. 9A.

The reason why a distance of more than ¼ of a wavelength λ is necessary is because light leaking from a light emitting element reaches the positions spaced from the element by ¼ of λ, and leakage light from light emitting elements neighboring each other will interfere with each other.

It is well known that in many kinds of organic material, combining between molecules is generated, or decomposition or phase changes, such as crystallization will occur, when receiving energy, such as light, heat, etc. The above-mentioned physical or chemical changes in organic material often cause the change of a refraction index. Therefore, it is possible to embed layers having a function of a translucent reflector in an organic light emitting thin film by forming a periodically arranged line or dot layer pattern in the organic thin film at a periodic length of ¼, ¾, 5/4 and so on, of a wavelength of emitted light, by making use of the change of a refraction index resulting from the physical or chemical change of the organic thin film. By those periodically formed layers, light proceeding in a direction perpendicular to each line layer or each dot layer is reflected and confined.

The above-mentioned light confinement according to the present invention is effective, especially for an organic light emitting element having a resonator structure formed by providing two reflector films, such as a laminated dielectric multilayer reflection film, at the top and bottom surfaces of an organic light emitting thin film.

In both of the directions parallel and perpendicular to the substrata, the largess effect of the light confinement can be obtained, if the periodic optical length, which is expressed as a geometrical length×a refraction index in material, of the embedded reflector layers in the organic thin film is ¼ of a wavelength of emitted light. Moreover, the largest effect of the light confinement can be obtained, if the depth of the resonator is ¼ or ½ of a wavelength. It depends on whether the total amount of phase shift due to light reflection by the reflector films is one or a half of a wavelength, which depth of ¼ or ½ of a wavelength brings the largest effect. A periodic length or a depth larger by ½ of a wavelength than the above-mentioned optimal periodic length or depth can satisfy the light confinement or resonance conditions.

Figure 17:
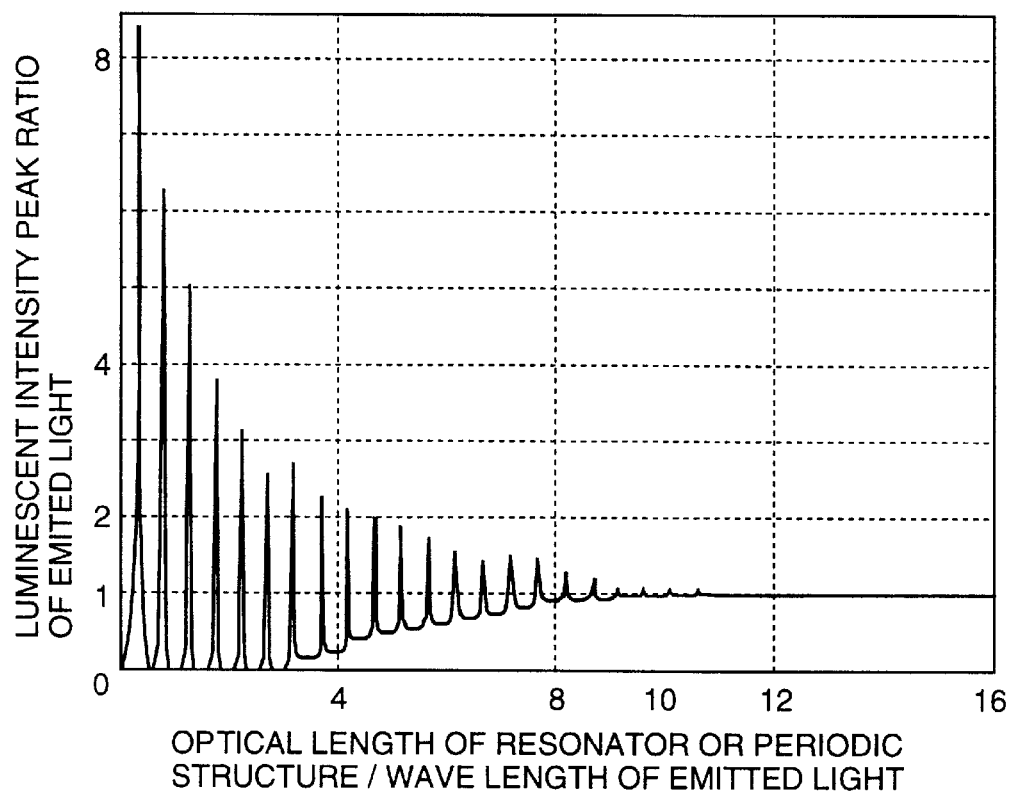
FIG. 17 is a graph showing the relation between a luminescent intensity peak ratio of emitted light and an optical length of a resonator or a periodical line type layer (optical length of a resonator or a periodical line type layer/a wavelength of emitted light).

There is actually an upper limit to an effective periodic length or a depth of a resonator, which is brought about by the unevenness of surfaces or boundary faces in the resonator end the periodically arranged layers in the organic light emitting thin film. That is, as the periodic length or depth of a resonator increases, a quantum effect, such as a microresonator effect, decreases, and the strength of the resonance becomes weak, which is caused by the unevenness of surfaces in the resonator. FIG. 17 is a graph showing the relation between a relative peak strength of emitted light and a relative optical length of a resonator or a line type layer. As seen in FIG. 17. it is necessary to set the optical length or depth to less than 10 times the wavelength in order to obtain a more than 10% effect related to the peak strength.

An organic light emitting thin film having a periodically arranged line or dot layer structure functions as a translucent reflector and reflects light with a definite ratio into the inside of the thin film.

Figure 10A:
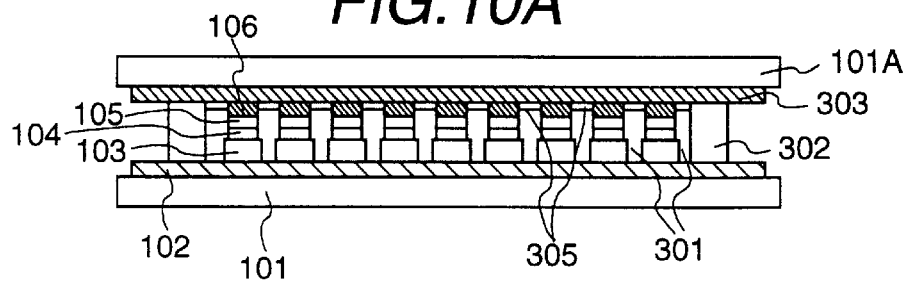
FIGS. 10A, 10B and 10C are diagrammatic views which show features of an optical device representing an embodiment according to the present invention, and are represented as a sectional view of the device, a composition of matrix type electrodes of the device, and a partial perspective view of the optical device, respectively.

FIG. 10A shows a luminescence panel using organic EL elements which have a three-dimensional light confinement structure. Each of the organic EL elements have the same composition as that of the organic light emitting element shown in FIG. 1. Numerals 101, 101A indicate two glass substrates, and numeral 102 indicates a laminated 6-layer translucent reflection film made of titanium oxide and silicon dioxide. Moreover, the structure includes transparent electrodes made of indium-tin oxide (ITO), which have a thickness of 200 nm, hole transport layers 104 made of triphenyl-diamine (TAD), which have a thickness of 50 nm, light emitting layers 105 made of aluminum chelate (ALQ), which have a thickness of 50 nm, and metal back surface electrodes 106 made of aluminum-lithium alloy (allele), which have a thickness of 200 nm. The two substrates 101 and 101A are adhered to each other with adhesive 302, and the light emitting elements are contained in a space 301 between the two substrates 101 and 101A. Dry nitrogen gas is enclosed in the space 301.

Figure 10B:
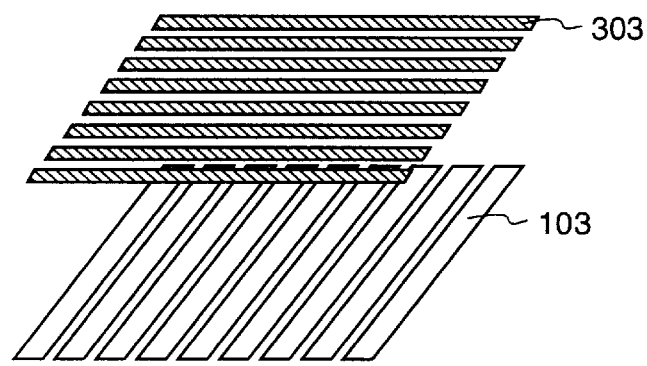

As shown in FIG. 10B, the transparent front surface electrodes 103 and the metal back surface electrodes 303 form a matrix type arrangement of electrodes by which light emitting parts are selected. Projecting parts 304, which are made of soft metal, such as In, are formed on the electrodes 303, and the transparent front surface electrodes 106 and the metal back surface electrodes 303 are pressurized and connected to each other via the projecting parts 304. In this composition, an insulating member is necessary to prevent the electrodes 103 from contacting to the electrodes 303 at places other than the luminescence pixel parts.

Figure 10C:
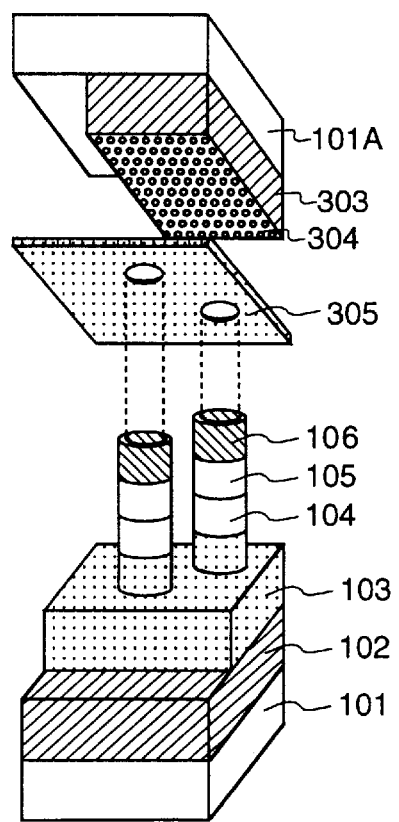
Figure 11:
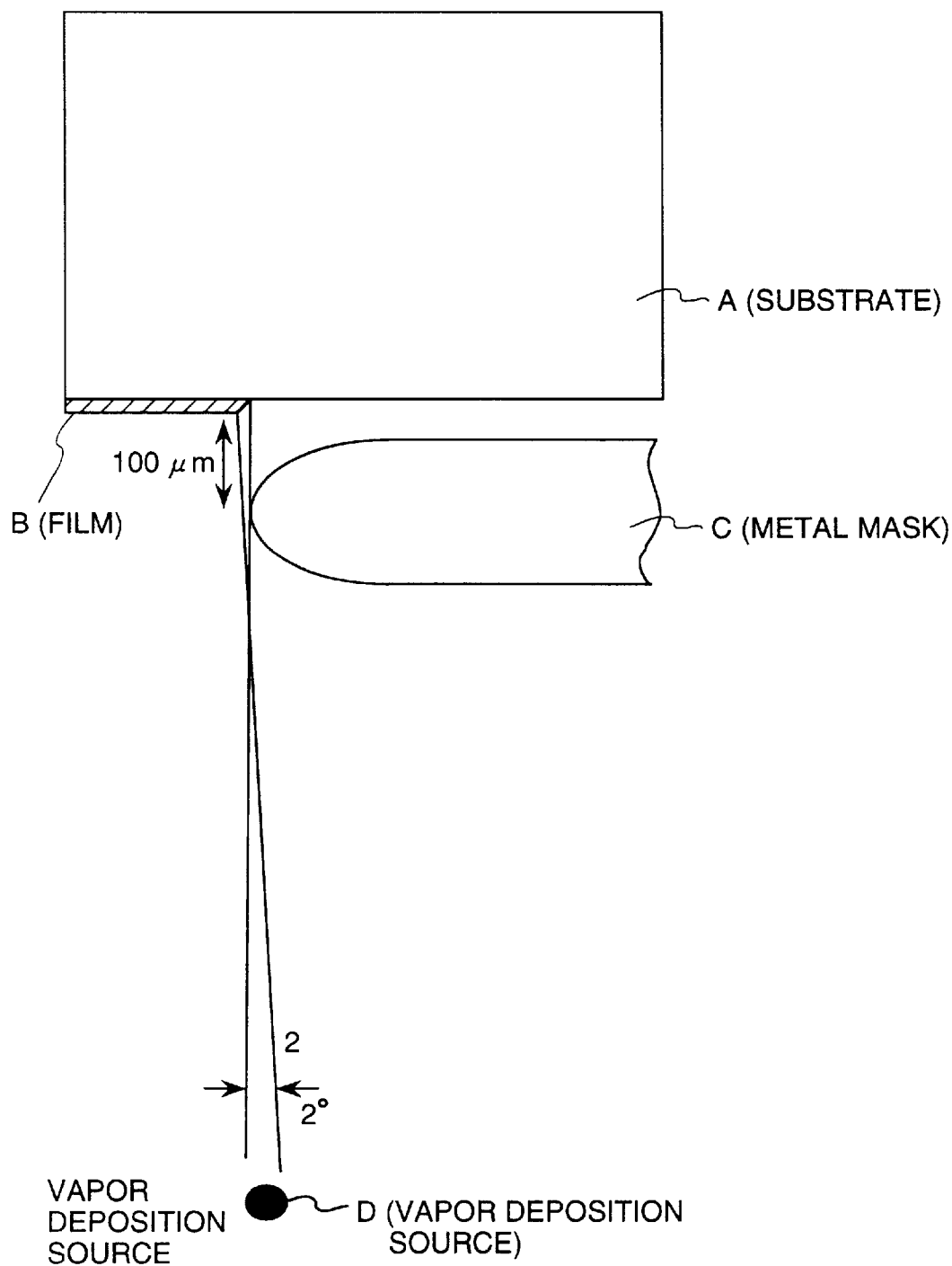
FIG. 11 is a diagram conceptually showing an arrangement for forming an organic thin film.
Figure 12:
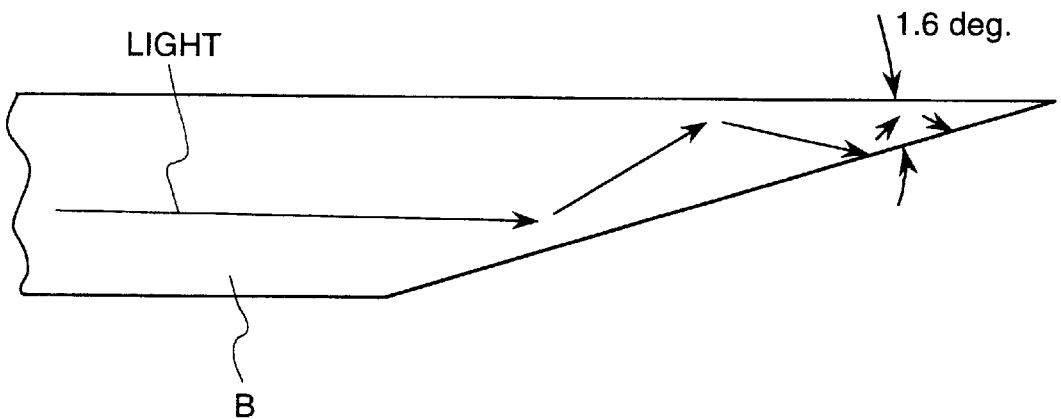
FIG. 12 is an enlarged sectional view of the peripheral side part of an organic thin film.

The number of organic light emitting elements arranged at each of the element areas, with the electrodes 303 and the electrodes 103 intersecting each other at the element areas as shown in FIG. 10B, is not restricted to one, but more than one organic light emitting element can be arranged at each of the element areas. In an embodiment shown in FIG. 10C, two light emitting elements are arranged at each of the element areas.

Figure 18:
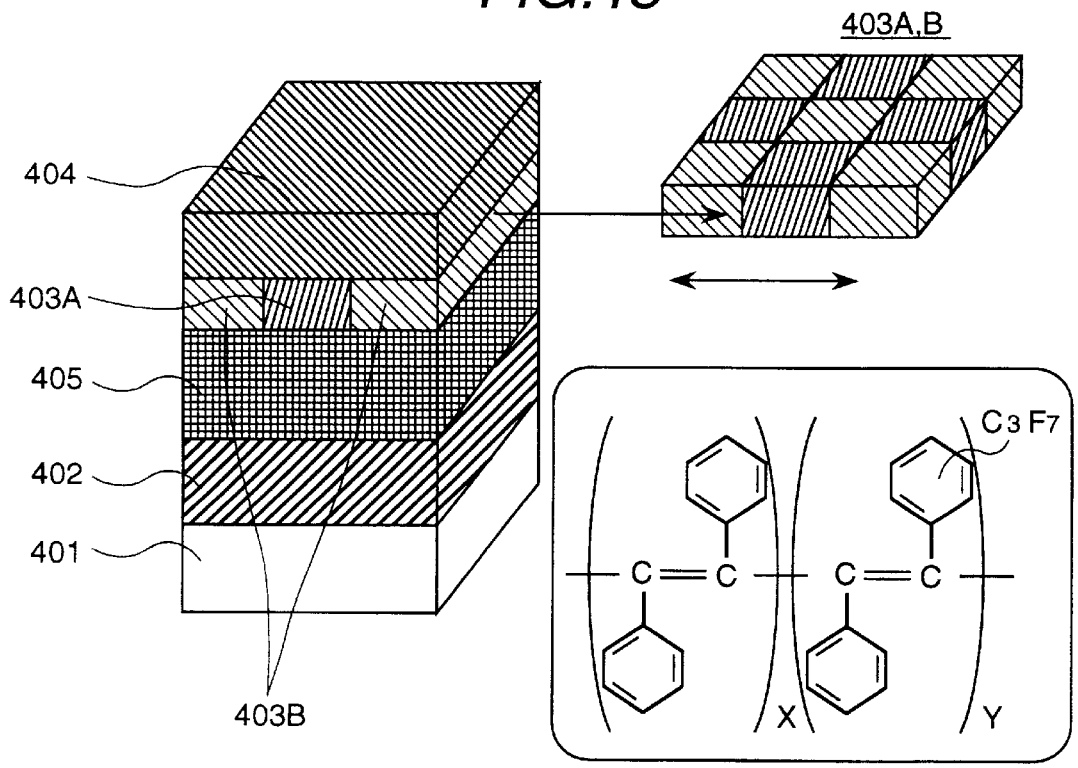
FIG. 18 is a diagrammatic perspective view for showing a composition of an organic electro-luminescence element having a micro-resonator structure wherein a structure of a periodically arranged line layer pattern is formed at a light emitting layer.

FIG. 18 is a sectional view of an organic light emitting element representing an embodiment according to the present invention. In the organic light emitting element shown in FIG. 18, a laminated-layer thin film composed of titanium oxide layers (the thickness of each layer is 54 nm) and silicon dioxide layers (the thickness of each layer is 86 nm) is used as a dielectric translucent reflection film. Moreover, in FIG. 18, the chemical structure of a polyacetylene derivative is shown, which is used for an organic light emitting layer. The refraction index of a polyacetylene film can be changed by growing the principal chain of carbon bonding in the polyacetylene derivative using a photoreaction processing. The spectrum of light emitted by the polyacetylene derivative can be changed by changing the kinds of molecules which are combined to branches of the polyacetylene derivative. The thickness of the metal back surface electrode 404 is 200 nm. Moreover, numeral 405 indicates a transparent electrode made of ITO and having a thickness of 200 nm. By applying a voltage between the electrodes 404 and 405, electrons and holes are injected into the light emitting layer and are recombined, to further excite the organic material of the layer. Thus, light is emitted from the excited organic material.

Although an example of an EL (electro-luminescence) element of a one layer type element structure has been explained with reference to FIG. 18, a report of a two layer type or more than 2 layer type EL element, in which the functions of the above-mentioned one layer type element are shared to two or more organic layers, has been presented, and those type EL elements are also applicable to the present invention.

In accordance with the present invention, since light emitted in a light emitting thin film is reflected into the inside of the layer by a peripheral side face of the shape formed according to the present invention at a definite ratio of the quantity of light reflected by the side face to the quantity of light reaching the side face, the lost quantity of emitted light can be reduced, and the total quantity of effective light output from the front surface of the light emitting thin film can be increased. That is, the ratio of the quantity of light output from a light emitting element to the quantity of energy input into the light emitting element is improved. By forming the above-mentioned structures for confining emitted light in a light emitting film, it is possible to form an organic light emitting element such that a light resonator is obtained, and a classical or quantum effect (correction of light emission enhancement due to the transition probability mechanism) due to the light confinement or the light resonance can be applied to the light emitting element.

What is claimed is:

1. An organic light emitting element having a resonator structure in a direction perpendicular to a substrate of said light emitting element, said resonator structure being composed by sandwiching an organic thin film in said light emitting element between reflectors, said organic light emitting element comprising:

one of a periodic line layer structure and a periodic dot layer structure in said organic thin film and a part of thin films formed on the top face and bottom faces of the organic thin film, in which line layers or dot layers are periodically arranged in parallel to said organic thin film, wherein each two line layers neighboring each other or each two dot layers neighboring each other have different material compositions or material structures, and a period of said layer arrangement, which is represented by an optical length expressed as a geometrical length×a refraction index in material of each layer, is substantially ¼ of a wavelength in each layer of light emitted in said organic thin film.

2. An organic light emitting element according to claim 1, wherein said period is (1+2m)/4 of the wavelength of light in each layer, where m is an integer taking a value in a range of 1 to 19.

3. An organic light emitting element according to claim 2, wherein said periodic layer structure is formed by using a near-field light.

4. An organic light emitting element according to claim 2, further including a translucent reflector and a transparent conductive film, composed of dielectric multilayer films, wherein said organic thin film emits light by applying a voltage to said organic thin film.

5. An organic light emitting element according to claim 2, wherein said periodic structure composes one of two-dimensional and three-dimensional resonators by making use of light reflection due to different refraction indexes in each two layers neighboring each of other.

* * * * *